United States Patent
Gillis et al.

(10) Patent No.: US 8,230,283 B2
(45) Date of Patent: Jul. 24, 2012

(54) METHOD TO TEST HOLD PATH FAULTS USING FUNCTIONAL CLOCKING

(75) Inventors: Pamela S. Gillis, Essex Junction, VT (US); Vikram Iyengar, Essex Junction, VT (US); Steven F. Oakland, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 285 days.

(21) Appl. No.: 12/641,456

(22) Filed: Dec. 18, 2009

(65) Prior Publication Data

US 2011/0154141 A1    Jun. 23, 2011

(51) Int. Cl.
G01R 31/28    (2006.01)
(52) U.S. Cl. ........................................ 714/731
(58) Field of Classification Search .................. None
See application file for complete search history.

(56) References Cited

U.S. PATENT DOCUMENTS

| | | | |
|---|---|---|---|
| 4,564,943 A | 1/1986 | Collins et al. | |
| 4,833,676 A | 5/1989 | Koo | |
| 5,617,426 A | 4/1997 | Koenemann et al. | |
| 6,046,984 A | 4/2000 | Grodstein et al. | |
| 6,058,496 A * | 5/2000 | Gillis et al. | 714/727 |
| 6,297,679 B1 | 10/2001 | Kim | |
| 6,581,197 B1 * | 6/2003 | Foutz et al. | 716/108 |
| 6,799,292 B2 | 9/2004 | Takeoka et al. | |
| 7,216,271 B2 | 5/2007 | Tanaka et al. | |
| 2001/0029593 A1 * | 10/2001 | Takeoka et al. | 714/720 |
| 2005/0138512 A1 | 6/2005 | Inuzuka et al. | |
| 2007/0011527 A1 | 1/2007 | Goswami et al. | |
| 2007/0089076 A1 | 4/2007 | Amatangelo | |
| 2008/0071489 A1 * | 3/2008 | Wissel | 702/79 |
| 2008/0201675 A1 * | 8/2008 | Wissel | 716/6 |
| 2010/0153895 A1 * | 6/2010 | Tetelbaum et al. | 716/6 |
| 2010/0153896 A1 * | 6/2010 | Sewall et al. | 716/6 |
| 2010/0271057 A1 * | 10/2010 | Cannon et al. | 324/750.01 |

OTHER PUBLICATIONS

B.K. Bullis, M.A. Wallace, "Asynchronous Reset Control of LSSD Parts", 2006, TBD 08-91 v34 n3 p. 448-451.
C. Metra, D. Rossi, M. Omana, J.M. Cazeaux, T.M. Mak, "Can Clock Faults Be Detected Through Functional Test?", Design and Diagnostics of Electronic Circuits and Systems, 2006 IEEE Apr. 18-21, 2006 pp. 166-171.
C.J. Dick, L. Jones, S.J. Mercier, T. Roche, "Method for Improved Stress Testing Of Performance In A Processor Using A Two-Phase Clock System", Jan. 1, 1989, TDB 01-89, pl 179-181.

(Continued)

Primary Examiner — Guerrier Merant
(74) Attorney, Agent, or Firm — Cantor Colburn LLP; Michael LeStrange (57) ABSTRACT

A system and method for detecting hold path faults in an integrated circuit is provided in exemplary embodiments. These exemplary embodiments introduce a method of identifying data paths within an integrated circuit with statistically the highest timing slack among the data paths within the integrated circuit that cover the entire process space of the circuit. By identifying these paths (i.e., shortest data paths), a robust test pattern can be generated that directly tests for hold path faults on short data paths within the integrated circuit using one functional clock pulse.

15 Claims, 6 Drawing Sheets

OTHER PUBLICATIONS

Nisar Ahmed, Mohammed Tehranipoor, Vinay Jayaram, "Timing-Based Delay Test For Screening Small Delay Defects", Design Automation Conference, 2006 43rd ACM/IEEE Jul. 24-28, 2006 pp. 320-325.

Dhiraj Goswami et al., "Test Generation in the Presence of Timing Exceptions and Constraints," 44th Design Automation Conference, ACM/IEEE, pp. 688-693, 2007.

A. Majumdarf et al., "Hold Time Validation on Silicon and the Relevance of Hazards in Timing Analysis," 43rd Design Automation Conference, ACM/IEEE, pp. 326-331, 2006.

S.M Reddy et al., "On Validating Data Hold Times for Flip-Flops in Sequential Circuits," Proceedings of the International Test Conference, pp. 317-325; 2000.

* cited by examiner

METHOD TO TEST HOLD PATH FAULTS USING FUNCTIONAL CLOCKING

BACKGROUND

The present invention relates generally to integrated circuit (IC) device testing techniques and, more particularly, to a method for testing hold path faults using functional clocking.

A hold fault occurs when there is a delay on the clock path to a capture memory element, and an intermediate memory element launches a transition twice in the time that the capture memory element captures only once. This causes data to move two levels of logic in one clock cycle or at one clock edge. A hold path fault occurs when a logic transition travels from a launch memory element down a short data path to a capture memory element faster than the clock signal can reach the capture memory element. The entire datapath is the fault site, as opposed to a transition fault, which is situated at a single node in a circuit.

The classical path fault model, based on launching a transition at a launch memory element, moving the transition robustly down the path-under-test, and capturing the transition at a capture memory element, can be used to test setup path faults on data paths in logic. However, test generation using the classical path fault model inherently favors setup tests on data paths. Hold path faults on short data paths are tested only serendipitously. Testing of hold path faults on short data paths is not guaranteed using classical path test generation algorithms, which incorporate two clock pulses to launch and capture a test pattern. In particular, the second clock pulse may overwrite the faulty value caused by a hold path fault, thus masking such a fault. Accordingly, hold path testing is a difficult problem.

At-speed structural test (ASST) tests setup delay faults on long paths (data path faults) well in logic. However, test generation inherently favors setup tests on long paths. Hold path faults on short paths are tested serendipitously. Testing of hold path faults on short paths is not guaranteed. Testing hold path faults on short paths requires only one clock pulse. ASST uses two pulses and the second pulse may overwrite the faulty value due to a hold path fault, such that the hold path fault is masked.

SUMMARY

According to one embodiment of the present invention, a method for detecting hold path faults in an integrated circuit structure is provided. The method includes identifying a set of data paths within the integrated circuit structure with at least one data path statistically having the highest timing slack within the integrated circuit structure, one data path traverses a setup storage device and a launch storage device and another data path traverses the launch storage device and a sink storage device; applying a test pattern to the integrated circuit structure to cause a data output pin of the launch storage device to assume a first logic value; generating a clock pulse along a clock path of the integrated circuit structure to cause the data output pin of the launch storage device to assume a second logic value opposite the first logic value, enabling a logic transition to travel robustly from the launch storage device to the sink storage device; and examining the sink storage device to determine whether the sink storage device captured the effect of the transition.

According to another embodiment of the present invention, a method for detecting hold path faults in an integrated circuit structure is provided. The method includes identifying a set of data paths within the integrated circuit structure, the set of data paths statistically having the highest timing slack within the integrated circuit structure and cover a process space of the integrated circuit in its entirety, one data path traverses a setup storage device and a launch storage device and another data path traverses the launch storage device and a sink storage device; applying a test pattern to the integrated circuit structure to cause a data output pin of the launch storage device to assume a first logic value; generating a clock pulse along a clock path of the integrated circuit structure to cause the data output pin of the launch storage device to assume a second logic value opposite the first logic value, enabling a logic transition to travel robustly from the launch storage device to the sink storage device; and examining the sink storage device to determine whether the sink storage device captured the effect of the transition.

According to yet another embodiment of the present invention, a system for detecting hold path faults in an integrated circuit structure is provided. The system includes an integrated circuit structure; a test generator; and a statistical timing system in signal communication with the integrated circuit structure, the statistical timing system identifies a set of data paths within the integrated circuit structure with at least one data path statistically having the highest timing slack within the integrated circuit structure, one data path traverses a setup storage device and a launch storage device and another data path traverses the launch storage device and a sink storage device, the test generator provides a test pattern to the integrated circuit structure to determine whether a hold path fault is detected within the integrated circuit structure.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Exemplary embodiments are directed to a method and apparatus for detecting hold path faults in an integrated circuit. These exemplary embodiments introduce a method of identifying data paths within an integrated circuit with statistically the highest timing slack among the data paths within the integrated circuit that cover the entire process space of the circuit. By identifying these paths (i.e., shortest data paths), a robust test pattern can be generated that directly tests for hold path faults on short data paths within the integrated circuit using one functional clock pulse. This implicitly tests for hold path faults along the clock path of the integrated circuit.

Hold path faults as described herein can be activated by either a single clock pulse or a single clock edge, and the exemplary embodiments of the present invention are equally applicable to both situations. Accordingly, the term "single clock event" is used to describe both a single clock pulse and a single clock edge. A single clock event can be a rising clock edge or a negative clock pulse.

Figure 1:
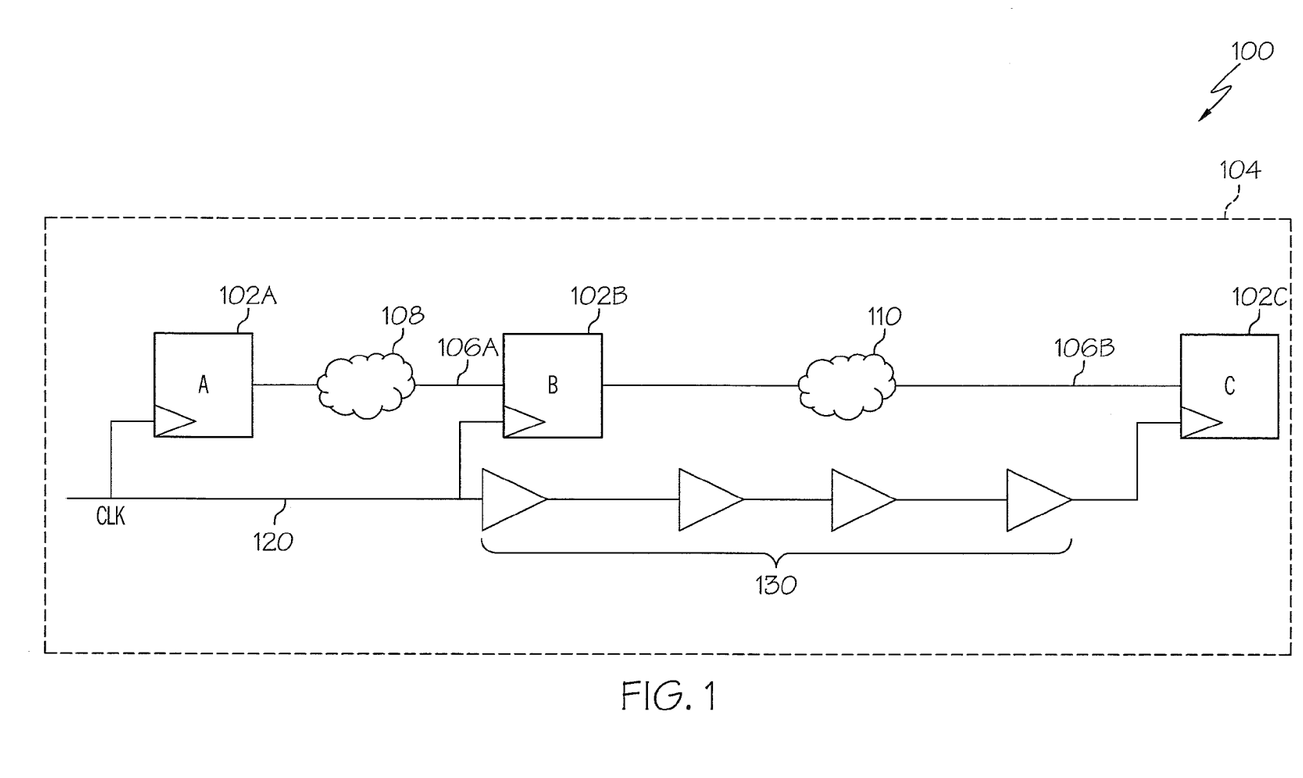
FIG. 1 is a schematic diagram of a simple integrated circuit structure in accordance with one exemplary embodiment of the present invention.

Hold path fault testing on integrated circuits in accordance with an embodiment of the present invention is described with reference to FIG. 1. FIG. 1 is a schematic of a simplified integrated circuit 100 that illustrates a situation in which a hold path fault may occur and a method for detecting the same in accordance with exemplary embodiments of the present invention. The integrated circuit 100 includes storage devices 102A-102C each labeled A, B, and C respectively. The storage devices 102A-102C are configured within a given process space 104 and can be any type of storage device, such as a flip-flops of any configuration (e.g., D-flip-flop), latches of any configuration (e.g., Level Sensitive Scan Design latches), etc. However, for ease of discussion, the storage devices will simply be referred to as "latches".

Data paths 106A, 106B traverse latches 102A, 102B, and 102C (referred to as latches A, B, C, respectively, hereinafter). In particular, latch A and latch B reside along data path 106A while latch B and C reside along data path 106B. Combinational logic 108, 110 each comprising one or more logic gates may exist along the data paths 106A, 106B as shown. To test for hold path faults or hold path timing violations, data paths 106A and 106B are each identified as the data paths to be tested. Then, a first logic value (e.g., logic 0) is scanned into latch B, which may also be referred to as a launch latch, to cause the data path 106B to go to logic 0. Latch C may also be referred to as a sink latch. A second logic value (e.g., logic 1), different from the first logic value, is scanned into latch A, which may also be referred to as a setup latch, such that the latch B changes its logic state upon a single clock event or a clock pulse. A single clock pulse is generated by a system clock (CLK) causing latch B to transition from logic 0 to logic 1. This rising logic transition then travels from latch B to latch C along data path 106B. Each latch is tied to the system clock along clock path 120 driving each latch in a synchronous manner. When the single clock pulse is generated, latch C should properly capture logic 0, which was the logic value scanned into the latch B prior to the single clock event, in the event that no hold path faults exists. If the combinational logic 110 is inverting logic, e.g., an inverter, NAND gate, or an AND-OR-INVERT gate, the rising transition launched from latch B will be inverted by logic 110 into a falling transition along data path 106B. In this case, latch C should properly capture logic 1. The effect of the transition would be for latch C to capture logic 0.

In order to test for a hold path fault, latch C is examined to determine whether latch C captured logic value 0 or 1. As previously mentioned, if latch C captures logic 0 upon issuance of the clock pulse, then no hold path fault is present since the value on data path 106B was properly captured by sink latch C. If however, the value in latch C is logic 1, a hold path fault is present since the value scanned into latch A propagated downstream all the way to latch C in a single clock pulse. Delay 130 can exist along clock path 18 causing hold path faults along data paths 106A and 106B to occur.

Figure 2:
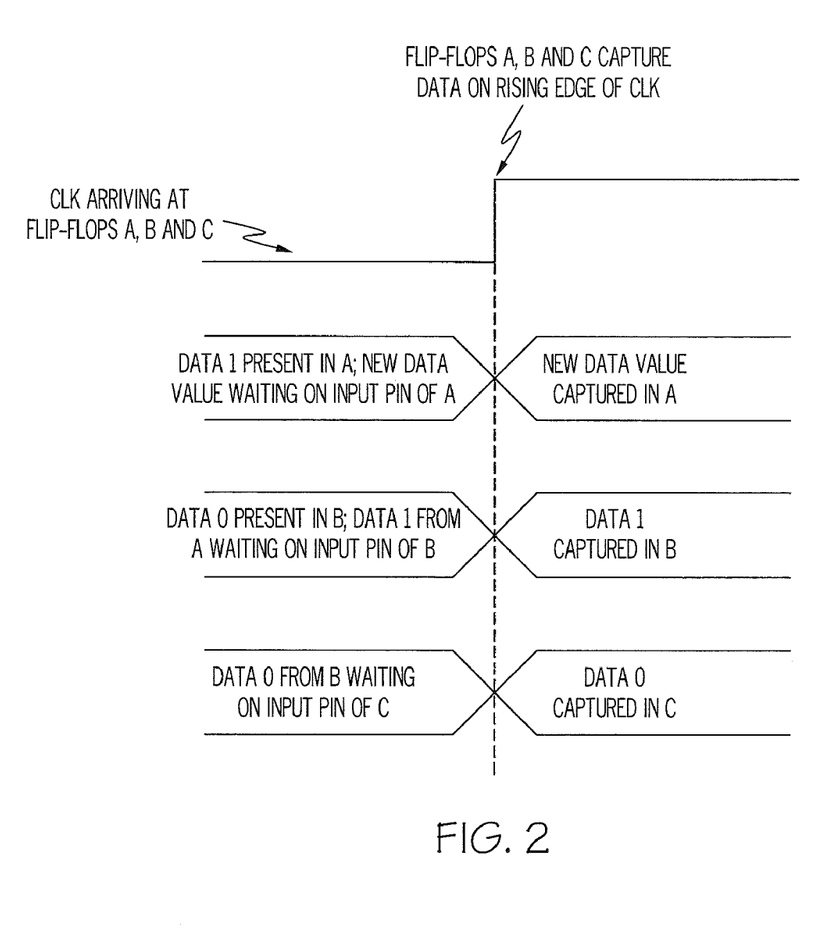
FIG. 2 is a timing diagram illustrating the transitioning of the latches within the integrated circuit structure of FIG. 1 during an at-speed test with no hold path faults detected in accordance with one exemplary embodiment of the present invention.

FIG. 2 is a timing diagram illustrating the transitioning of the latches during an at-speed test with no hold path faults detected. As can be seen, the system clock CLK arrives at latches A, B, and C enabling the latches to capture data on the rising edge of the CLK or at a single clock event. In this example, it is assumed that logic 1 is present in latch A, logic 0 is present in latch B and is waiting on logic 1 from latch A in its input cone, and latch C is waiting on logic 0 from latch B in its input cone. At the rising edge of the CLK, new data is captured in latch A, data 1 is captured in latch B and data 0 is captured in latch C.

Figure 3:
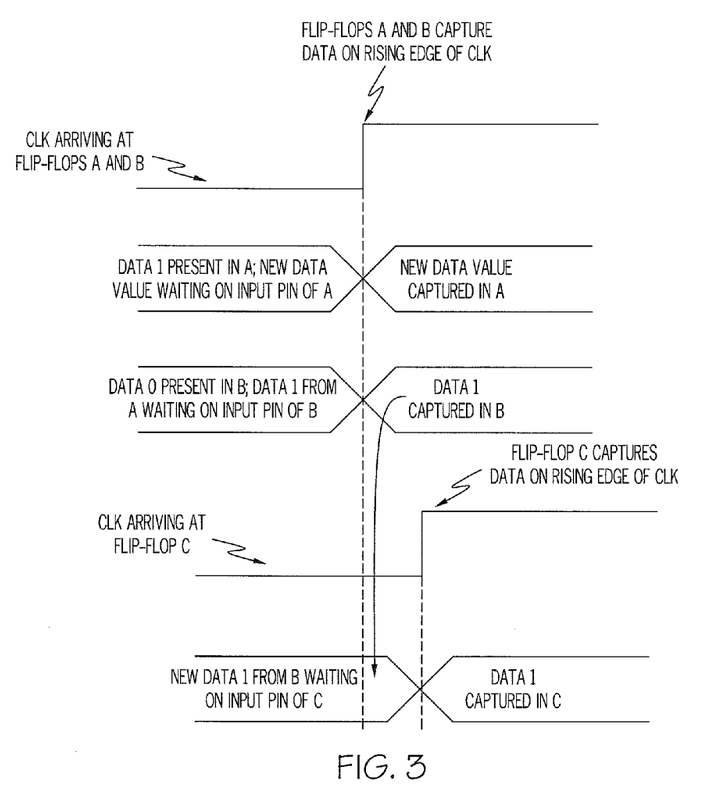
FIG. 3 is a timing diagram illustrating the transitioning of the latches within the integrated circuit structure of FIG. 1 during an at-speed test with hold path faults detected in accordance with one exemplary embodiment of the present invention.

FIG. 3 is another timing diagram now illustrating the transitioning of the latches during an at-speed test with hold path faults detected. In this example, the clock CLK arriving at latch C is delayed. Therefore, instead of latch C capturing at the rising edge of the CLK arriving at latches A and B as described above, it captures data on the rising edge of the delayed CLK. As a result, latch C captures logic 1, the data that latch A sent to latch B, and that manifested in the transition that traveled from latch B to latch C, instead of the data that was residing in latch B at the time the clock event was issued. This happens because data is transferred from latch A to latch B before latch C receives the clock event.

Figure 4:
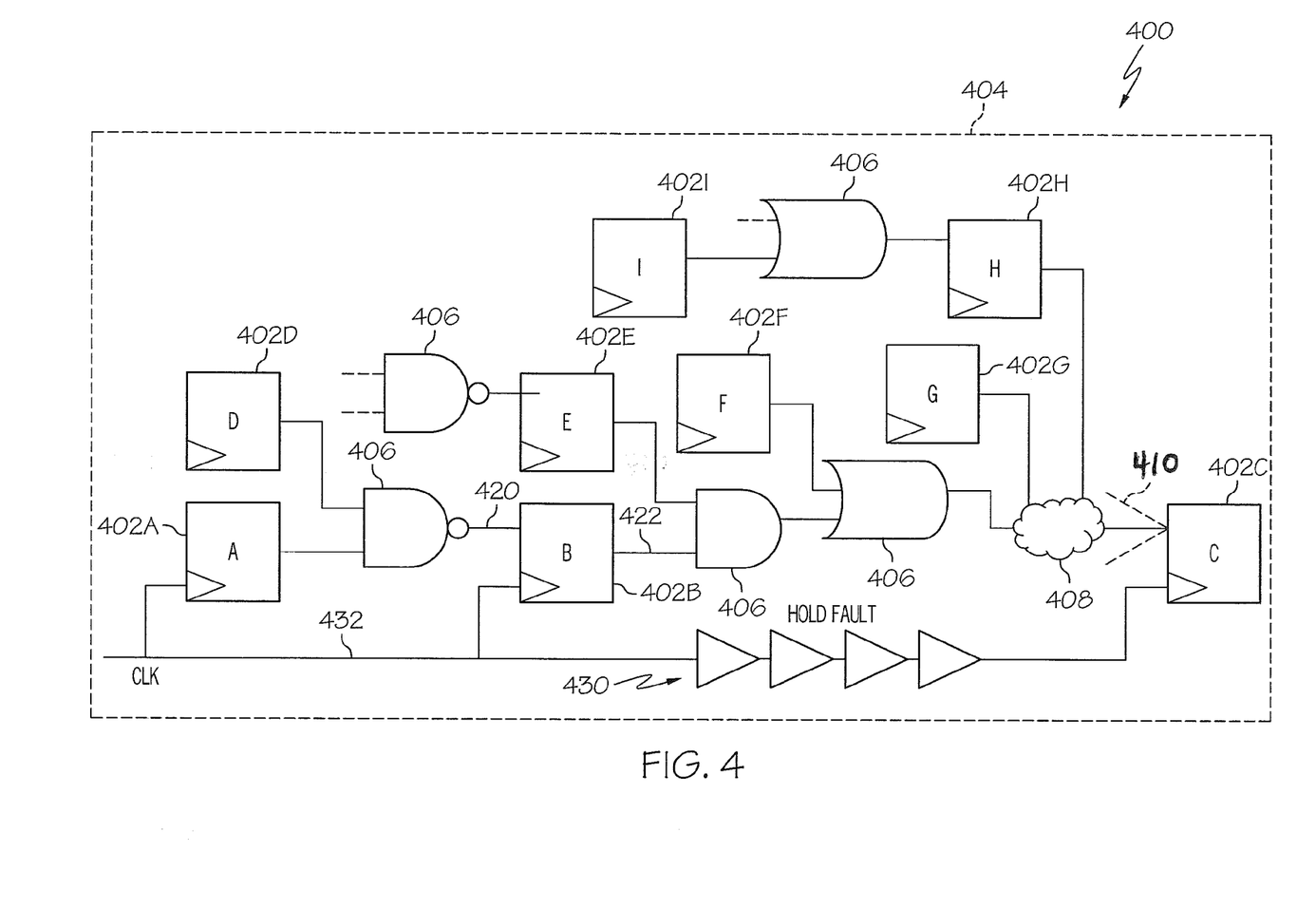
FIG. 4 is a schematic diagram of a complex integrated circuit structure in accordance with one exemplary embodiment of the present invention.

Further embodiments of hold path fault testing are described with reference to a complex integrated circuit structure 400 in FIG. 4. Integrated circuit structure 400 includes a plurality of storage devices 402A-402H (referred to herein after as latches A-H) configured within a process space 404. Logic may be situated between latches, thereby forming one or more data paths within the structure. Logic is generally depicted here as one or more gates 406 or as combination logic 408, which can include a combination of gates and interconnects/nodes. As such, a number of different data paths can be tied to one or more latches in the structure 400. For example, latch C can have a fan-in logic cone 410 comprising of one or more different data paths. In other words, a number of data paths can cause the input pin of latch C to assume a particular logic value. The number of data paths should not be limited to the number shown in FIG. 4.

In accordance with one embodiment, a set of data paths is selected for testing the circuit structure 400 for hold path faults. In one embodiment, at least one data path selected is statistically the highest timing slack data path between two latches. In other words, the data path selected is statistically the shortest data path among the data paths between two devices. In one specific embodiment, the set of data paths selected for testing within the integrated circuit is statistically the highest timing slack data paths within the circuit structure 400 and covering the entire process space 404 of the circuit structure 400. For argument sake, the set of data paths with statistically the highest timing slack and covering the entire process space 404 of the structure 400 are identified in the structure 400 in FIG. 4 as data paths 420, 422. In this example, latch A and latch B reside on data path 420 while latch B and latch C reside on data path 422. Therefore, testing of hold path faults on short paths can be accomplished, thereby guaranteeing a robust hold fault path test.

Once the set of data paths statistically having the highest timing slack and covering the entire process space 404 within the integrated structure 400 are identified, a robust path test is generated using a single clock event. Specifically, a test pattern is generated that robustly exercises the set of short data paths to be tested. The test pattern is applied to the circuit structure 400 causing the output cone of latch B to assume a first logic value (e.g., logic value 0). A clock (CLK) arrives at each of the latches to cause the output cone of latch B to assume a second logic value (e.g., logic value 1) opposite the first logic value, and enable the rising logic transition to travel from latch B to latch C.

To test for actual hold path faults on the short data paths, latch C is sampled or examined. If the value captured in latch C is logic 0, then no hold path fault is detected since the value on short data path 422 was properly captured by latch C. If however, the value captured in latch C is logic 1, a hold path fault is detected since the value in latch A propagated downstream to latch C. Delay 430 can exist along clock path 432 causing hold path faults along data paths 420, 422 to occur.

Figure 5:
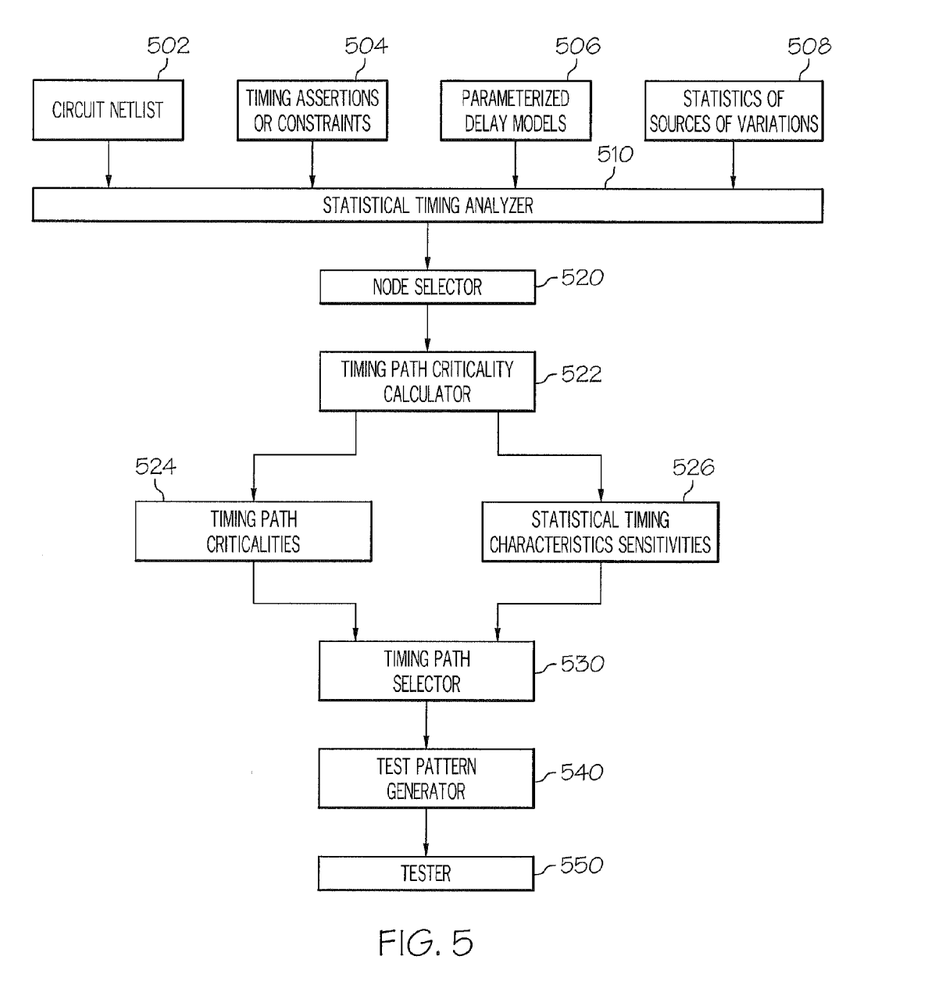
FIG. 5 is a block diagram of a statistical test system used for identifying a set of data paths statistically having the highest timing slack in the integrated circuit structure in accordance with one exemplary embodiment of the present invention.

In accordance with one embodiment, the set of data paths statistically having the highest timing slack can be identified by test system 500. One embodiment of a statistical timing test system 500 used to identify a set of data paths statistically having the highest timing slack within a circuit structure is shown in FIG. 5. The test system 500 may be configured to receive a plurality of inputs, such as first, second, third, and fourth inputs 502, 504, 506, 508. The first input 502 is a circuit netlist that represents the structure of a circuit to be analyzed, which for example is structure 400. Second input 504 is a set of timing assertions or constraints. In one example, timing assertions or constraints 504 may include arrival times at primary inputs, required arrival times at primary outputs, information about phases of a clock, details of external loads driven by the primary outputs, etc. The timing assertions or constraints may be in the form of, for example, deterministic numbers, independent probability distributions, correlated probability distributions, and any combinations thereof. Third input 506 is a set of parameterized delay models that allow a timer to determine the delay of a gate or wire as a function of delay-model variables (e.g., input slew or rise/fall time, and output load) as well as a function of sources of variation. Fourth input 508 is information about the statistics of sources of variation. In one example, the sources of variation include a list of sources of variation with a mean value and standard deviation for each source of variation.

The test system 500 includes a statistical timing analyzer 510, which is configured to receive inputs 502, 504, 506, 508. In one example, statistical timing analyzer 510 may be described in U.S. Pat. No. 7,111,260, which is titled "System and Method for Incremental Statistical Timing Analysis of Digital Circuits" and is incorporated herein by reference in relevant part. The '260 patent describes a system and method for efficiently and incrementally updating the statistical timing of a digital circuit after a change has been made in the circuit. One or more changes in the circuit is/are followed by timing queries that are answered efficiently, constituting a mode of timing that is most useful in the inner loop of an automatic computer-aided design (CAD) synthesis or optimization tool. In the statistical re-timing of the '260 patent, the delay of each gate or wire is assumed to consist of a nominal portion, a correlated random portion that is parameterized by each of the sources of variation, and an independent random portion. Correlations are taken into account. Both early mode and late mode timing are included, both combinational and sequential circuits are handled, and static CMOS as well as dynamic logic families are accommodated.

Based on the statistical timing analysis of statistical timing analyzer 510 a node selector 520 identifies a plurality of critical nodes within the integrated circuit design of interest (e.g., structure 400). In one example, a certain number of the most critical nodes are selected. Based on these selected critical nodes, a timing path criticality calculator 522 calculates the probability of criticality for each timing path that contains the selected nodes through well-known criticality calculations. For example, a criticality of a certain timing path provides the probability of manufacturing a chip in which the certain timing path is a timing-critical signal propagation path.

Timing path criticality calculator 522 generates a list of timing path criticalities 524. In one example, timing path criticalities 524 includes a list of one or more critical paths passing through each critical node, as determined by well-known path tracing procedures, and their respective percent criticality values, which may be listed in order from highest criticality to lower criticality or vice versa. The concept of critical paths and nodes is illustrated with reference to the structure shown in FIG. 4.

In the example, data paths 420, 422 can be exemplary critical paths that fall within the process space 404 of structure 400. In this example, latch B can be considered a critical node that has a high criticality probability value because it lies along the path of both data paths 420, 422.

Referring again to FIG. 5, timing path criticality calculator 522 further generates a list of statistical timing characteristics sensitivities 526. In one example, calculator 522 computes the sensitivity of timing characteristics 526 of the integrated circuit (such as timing slack) to sources of variation. These sensitivities help estimate how chip timing will change due to process variation. They further help estimate circuit performance as a probability distribution. Finally, the sensitivities help estimate the robustness of chip designs.

Based on timing path criticalities 524 and statistical timing characteristics sensitivities 526, a set of timing paths to be tested (e.g., data paths 420, 422) are selected using a timing path selector 530. A test pattern generator 540 is used to generate test patterns that robustly exercise each of the paths to be tested, which are provided by timing path selector 146. In one example, a unique test pattern is generated for each path to be test, such as a unique test pattern for data path 420 and a unique test pattern for data path 422 of structure 400 of FIG. 4. In another example, a single test pattern can be generated that exercises both data paths 420, 422.

The test patterns generated by test pattern generator 540 are applied to the structure under test using a tester 550, which can be any suitable tester for testing integrated circuits, such as a conventional at-speed structural testing (ASST) tester. In one example, tester 550 may be a product characterization tester for performing diagnostics and analyzing product defects in a laboratory environment. In another example, tester 550 may be a manufacturing tester in a manufacturing environment for supplying integrated circuit devices of a certain performance specification to customers.

Of course, other available or later developed statistical timing tools and methods to identify data paths with the highest timing slack within the integrated circuit structure and cover the entire process space of the structure can be used in other embodiments and should not be limited to the configurations and methods described herein.

Figure 6:
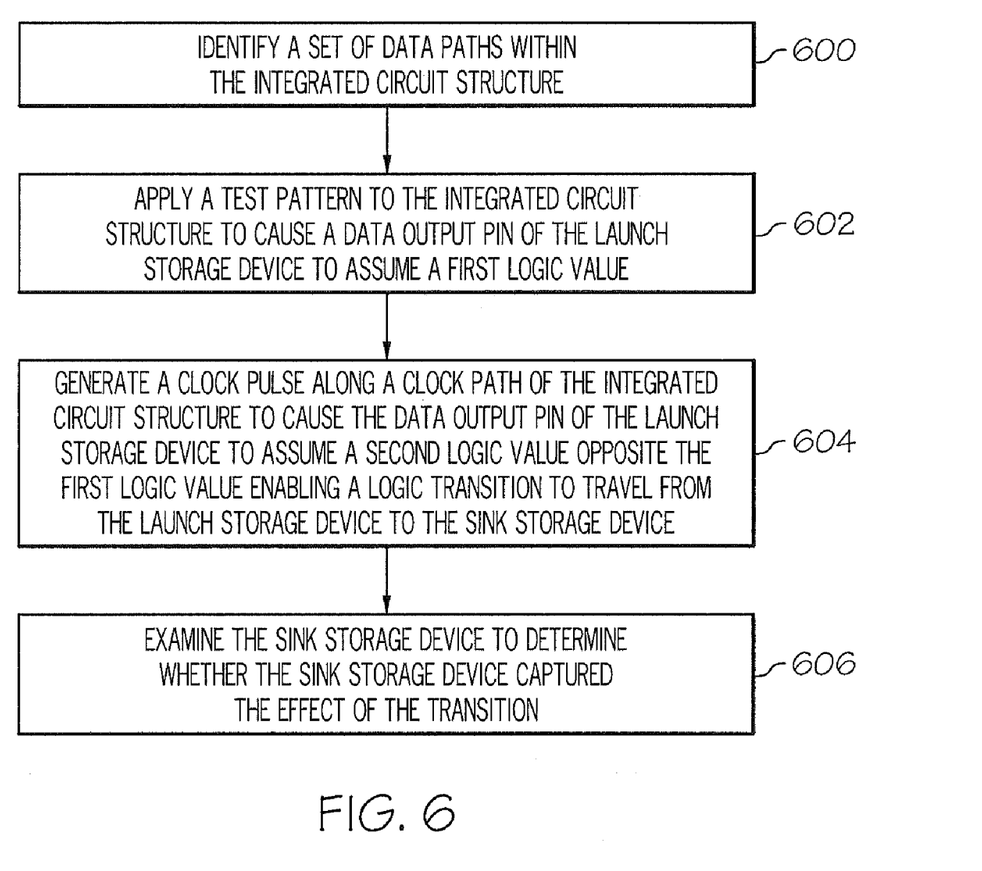
FIG. 6 is a flow diagram that provides a method for detecting hold path faults in an integrated circuit structure.

FIG. 6 is a flow diagram illustrating a method for detecting hold path faults in an integrated circuit structure in accordance with one exemplary embodiment of the invention. As shown in block 600, the process begins by identifying a set of data paths within the integrated circuit structure. In one exemplary embodiment, the set of data paths can be identified using test system 500. Of course, other systems or variations thereof can be used in other exemplary embodiments. In one embodiment, at least one data path statistically having the highest timing slack within the integrated circuit structure is identified. In another embodiment, the set of data paths statistically has the highest timing slack within the integrated circuit structure and covers the entire process space of the structure. As shown in block 602, apply a test pattern to the integrated circuit structure to cause a data output pin of the launch storage device to assume a first logic value. At block 604, generate a clock pulse along a clock path of the integrated circuit structure to cause the data output pin of the launch storage device to assume a second logic value opposite the first logic value enabling a logic transition to travel robustly from the launch storage device to the sink storage device. Then, as shown in block 606, examine the sink storage device to determine whether the sink storage device captured the effect of the transition.

The exemplary embodiments of the present invention described herein are applicable to various designs styles and should not be limited to the examples described herein. For example, the structures and methods described herein are fully applicable to LSSD latches and mux scan flip-flops, and work equally well without LSSD. Advantageously, hold path faults on short paths can be tested directly and not only serendipitously during test generation for long paths.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for detecting hold path faults in an integrated circuit structure, comprising:
   identifying a set of data paths within the integrated circuit structure with at least one data path statistically having the highest timing slack within the integrated circuit structure, one data path traverses a setup storage device and a launch storage device and another data path traverses the launch storage device and a sink storage device;
   applying a test pattern to the integrated circuit structure to cause a data output pin of the launch storage device to initially assume a first logic value;
   generating a clock pulse along a clock path of the integrated circuit structure to cause the data output pin of the launch storage device to assume a second logic value opposite the first logic value, enabling a logic transition to travel from the launch storage device to the sink storage device; and
   examining the sink storage device to determine whether the sink storage device captured the effect of the transition, wherein a hold path fault is detected in the integrated circuit structure when the sink storage device captures the second logic value upon issuance of the clock pulse as a result of the transition of the data output pin of the launch storage device from the first logic value to the second logic value reaching a data input pin of the sink storage device prior to the sink storage device receiving the clock pulse.

2. The method of claim 1, wherein the clock pulse is generated in a manner so as to enable the generation of a single clock event.

3. The method of claim 2, wherein the signal clock event and the test pattern enables the generation of a robust path test on the integrated circuit structure.

4. The method of claim 1, wherein the set of data paths identified within the integrated circuit structure covers a process space of the integrated circuit in its entirety.

5. The method of claim 1, wherein the test pattern applied to the integrated circuit structure is an at-speed structural test (ASST) pattern.

6. The method of claim 1, wherein each storage device is a latch or a flip-flop.

7. The method of claim 1, wherein the integrated circuit structure is a level sensitive scan design (LSSD).

8. The method of claim 1, wherein a statistical timing system identifies the set of data paths to be tested within the integrated circuit structure by performing a timing path criticality calculation.

9. A method for detecting hold path faults in an integrated circuit structure, comprising:
   identifying a set of data paths within the integrated circuit structure, the set of data paths statistically having the highest timing slack within the integrated circuit structure and cover a process space of the integrated circuit in its entirety, one data path traverses a setup storage device and a launch storage device and another data path traverses the launch storage device and a sink storage device;
   applying a test pattern to the integrated circuit structure to cause a data output pin of the launch storage device to initially assume a first logic value;
   generating a clock pulse along a clock path of the integrated circuit structure to cause the data output pin of the launch storage device to assume a second logic value opposite the first logic value, enabling a logic transition to travel from the launch storage device to the sink storage device; and examining the sink storage device to determine whether the sink storage device captured the effect of the transition, wherein a hold path fault is detected in the integrated circuit structure when the sink storage device captures the second logic value upon issuance of the clock pulse as a result of the transition of the data output pin of the launch storage device from the first logic value to the second logic value reaching a data input pin of the sink storage device prior to the sink storage device receiving the clock pulse.

10. The method of claim 9, wherein the clock pulse is generated in a manner so as to enable the generation of a single clock event.

11. The method of claim 9, wherein the test pattern applied to the integrated circuit structure is an at-speed structural test (ASST) pattern.

12. The method of claim 9, wherein the integrated circuit structure is a level sensitive scan design (LSSD).

13. The method of claim 9, wherein a statistical timing system identifies the set of data paths to be tested within the integrated circuit structure by performing a timing path criticality calculation.

14. A system, comprising:
an integrated circuit structure;
a test generator; and
a statistical timing system in signal communication with the integrated circuit structure, the statistical timing system identifies a set of data paths within the integrated circuit structure with at least one data path statistically having the highest timing slack within the integrated circuit structure, one data path traverses a setup storage device and a launch storage device and another data path traverses the launch storage device and a sink storage device, the test generator provides a test pattern to the integrated circuit structure to determine whether a hold path fault is detected within the integrated circuit structure, wherein:

the test pattern causes a data output pin of the launch storage device to assume a first logic value;

generation of a single clock pulse along a clock path of the integrated circuit structure causes the data output pin of the launch storage device to assume a second logic value opposite the first logic value enabling a logic transition to travel from the launch storage device to the sink storage device; and examination of the sink storage device determines whether the sink storage device captured the effect of the transition, wherein a hold path fault is detected in the integrated circuit structure when the sink storage device captures the second logic value upon issuance of the clock pulse as a result of the transition of the data output pin of the launch storage device from the first logic value to the second logic value reaching a data input pin of the sink storage device prior to the sink storage device receiving the clock pulse.

15. The system of claim 14, wherein the set of data paths identified within the integrated circuit structure covers a process space of the integrated circuit structure in its entirety.

* * * * *